(12) United States Patent
Kawai

(10) Patent No.: US 6,396,328 B2
(45) Date of Patent: May 28, 2002

(54) VARIABLE CAPACITANCE CIRCUIT

(75) Inventor: Kazuo Kawai, Tokyo (JP)

(73) Assignee: General Research of Electronics Inc., Tokyo (JP)

( * ) Notice: Subject to any disclaimer, the term of this patent is extended or adjusted under 35 U.S.C. 154(b) by 0 days.

(21) Appl. No.: 09/730,448

(22) Filed: Dec. 5, 2000

(30) Foreign Application Priority Data

Dec. 16, 1999 (JP) .............................. 11-357054

(51) Int. Cl.[7] ................................................ G06F 7/64
(52) U.S. Cl. ........................................ 327/334; 327/335
(58) Field of Search .............................. 327/334, 103, 327/231, 238, 237, 254, 255, 335, 378; 323/212, 313; 331/176

(56) References Cited

U.S. PATENT DOCUMENTS

| | | | | |
|---|---|---|---|---|
| 3,878,724 A | * | 4/1975 | Allen ........................... | 327/334 |
| 4,404,428 A | * | 9/1983 | Hirata et al. ................ | 327/238 |
| 5,621,306 A | * | 4/1997 | Ise ............................... | 323/313 |
| 5,990,754 A | * | 11/1999 | Sakurai ....................... | 331/176 |
| 5,999,063 A | * | 12/1999 | Sakurai et al. .............. | 331/176 |
| 6,054,883 A | * | 4/2000 | Ishihara ....................... | 327/255 |
| 6,160,434 A | * | 12/2000 | Yoshimura et al. ......... | 327/238 |
| 6,218,885 B1 | * | 4/2001 | Ellis ............................ | 327/278 |

* cited by examiner

*Primary Examiner*—Terry D. Cunningham
*Assistant Examiner*—Linh Nguyen
(74) *Attorney, Agent, or Firm*—Flynn, Thiel, Boutell & Tanis, P.C.

(57) ABSTRACT

A variable capacitance circuit enables electrostatic capacity to be adjusted as a trimmer capacitor, and that enables a temperature characteristic to be set variably. An input voltage is made to lead by a phase angle of 90° due to a differentiating circuit, before being amplified by an in phase amplifier, thus a current with phase angle of 90° shifted is obtained in such a manner as to take out the output while passing through a resistor. Gain and/or an output resistance of the amplifier are made to set variable. If a thermistor is combined with the circuit as a resistance of the differentiating circuit, temperature coefficient can be made to set variable.

12 Claims, 2 Drawing Sheets

VARIABLE CAPACITANCE CIRCUIT

BACKGROUND OF THE INVENTION

1. Field of the Invention

The present invention relates to a variable capacitance circuit which is suitable for fine adjustment of a frequency-amplitude characteristic or a frequency-phase characteristic of a negative-feedback operational amplifier.

2. Description of the Related Art

In some cases, in the negative-feedback amplifier employing the operational amplifier (hereinafter referred to as OP-amplifier), adjustment of a frequency-amplitude characteristic or a frequency-phase characteristic is necessary. In such a case, generally, variable capacitance circuit is employed. A method of adjustment is that a feedback resistor or an input resistor of the negative-feedback amplifier is connected to a trimmer capacitor of minor capacitance in parallel, followed by adjusting the electrostatic capacity. Such adjustment method is applied to, for instance, a notch filter and so forth employing the above-described negative-feedback amplifier in order to obtain a deep notch characteristic with high "Q". In such a case, exceedingly fine adjustment is required. Further, in this case, it is desirable that a temperature characteristic of a variable adjustment circuit itself for correction employed for the sake of this adjustment is made to meet with a temperature characteristic, which is required for the whole other circuits.

Consequently, a variable capacitance circuit for characteristic correction, which is employed for achieving an object of such adjustment, is required to possess function capable of establishing the electrostatic capacitance as well as the temperature coefficient in connection with respective necessary values. However, a trimmer capacitor with such function is not developed yet. Of course, it is possible to select a trimmer capacitor with necessary temperature characteristic from among many trimmer capacitors. However, since such selection requires enormous times, it is not realistic.

SUMMARY OF THE INVENTION

An object of the present invention is to provide a variable capacitance circuit which has two functions that electrostatic capacitance of the circuit can be varied such as the trimmer capacitor and further it is possible to establish the electrostatic capacitance against its necessary predetermined temperature coefficient that is temperature compensation function.

In order to attain the above-described object, a variable capacitance circuit of the present invention is provided with a first circuit for generating an output voltage which leads an input voltage by a phase angle of 90°, a second circuit for performing in phase amplification to the output voltage, followed by taking out an output current corresponding to this amplified output voltage, and variable means for varying the output current of the second circuit.

Also, in the variable capacitance circuit of the present invention, it is suitable that a temperature compensation temperature-sensitive circuit is combined with the first or the second circuit.

Further, in the variable capacitance circuit of the present invention, it is suitable that the second circuit includes an operational amplifier and a temperature transducer is made to combine with an input circuit of the operational amplifier, or the first circuit is configured by a differentiating circuit consisting of a capacitor and a resistance circuit and the temperature transducer is made to combine with the resistance circuit.

Furthermore, in the present invention, it is suitable that the second circuit is an amplifier of a current output type. While it is suitable that the second circuit includes an amplifier of a voltage output type and variable resistor connected to output of the amplifier.

The trimmer capacitor has a function of varying magnitude of electrostatic capacity. This function is that an output current which leads an applied input voltage by a phase angle of 90° changes magnitude thereof. Consequently, with respect to this function, in the first place, a phase of applied input voltage is made to advance by a phase angle of 90°, then, this voltage with the phase angle of 90° advanced is subjected to in phase amplification by an amplifier before this amplified output voltage is taken through an output resistance. Since the output current flowing through the resistance is the same phase as a current flowing through the above described electrostatic capacity, if an amplification degree of the above-described amplifier and/or the output resistance are made to vary, magnitude of the output current can be varied. Therefore, the above described function can be realized. Further, this amplification degree and/or the output resistance can be varied, and if a temperature transducer such as thermistor and so forth is combined with this circuit, sensitivity can be adjusted. This enables the circuit to have a necessary temperature coefficient.

DETAILED DESCRIPTION OF THE PREFERRED EMBODIMENTS

Figure 1A:
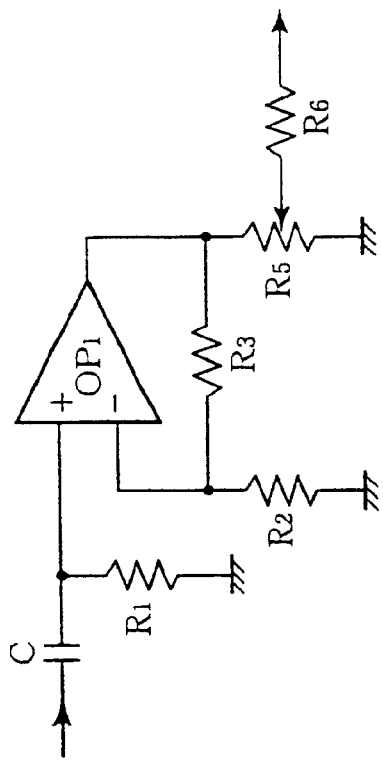
FIGS. 1(A)–1(C) are circuit views illustrating respective embodiments of the present invention.
Figure 1B:
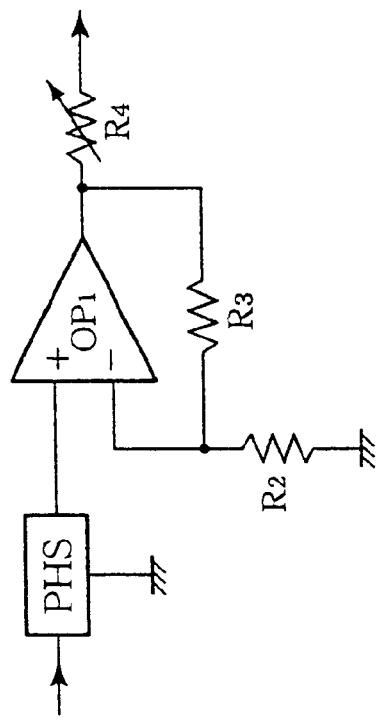
Figure 1C:
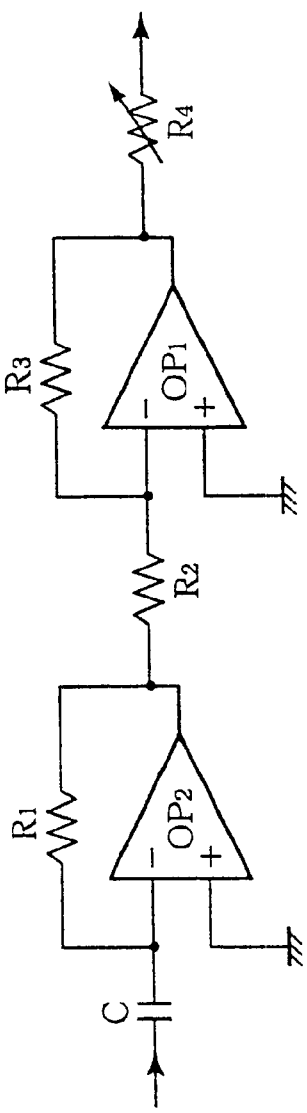

Embodiments of the present invention will now be specifically explained with reference to the drawings. FIG. 1(A)–1(C) are respective embodiments of roughly equivalent variable capacitance circuits to the trimmer capacitor. All of the three variable capacitance circuits have a configuration of a voltage-input and a current-output. The variable capacitance circuit employs an operational amplifier OP1 of voltage-output type and a variable resistor $R_4$ or a potentiometer $R_5$ and fixed resistor $R_6$. In FIG. 1($a$), PHS is a 90°-phase shifter, OP1 is an operational amplifier, $R_2$ to $R_4$ are resistors. In FIG. 1(B), a differentiating circuit is configured in such a manner that a capacitor C and a resistor $R_1$, instead of a 90°-phase shifter PHS, are selected so that it makes $1/\omega C \gg R_1$ against a use frequency. For that reason, since roughly 90°-phase shift can be realized, a circuit of FIG. 1(B) is simple as the case may be. Also a circuit of FIG. 1(C), in which a differentiating circuit is configured by a capacitor C, an operational amplifier OP2 and a resistor $R_1$ are in roughly the same configuration as that of FIG. 1(B).

Thus, the 90°-phase shift is set by virtue of some method or other. Subsequently, a voltage amplifier OP1 sets a variable gain amplifier and/or causes the output resistors $R_4$, $R_5$ to be variable. If an output current is obtained through the above-described circuit configuration, it is possible to obtain an output current roughly similar to that of the trimmer capacitor. Consequently, if the temperature compensation circuit is combined with this circuit, it is possible to realize a variable capacitance circuit having a required temperature coefficient.

Moreover, if a current output type amplifier is employed as this amplifier OP1, of course, the output resistor $R_4$ or $R_5$, $R_6$ are unnecessary.

Figure 2:
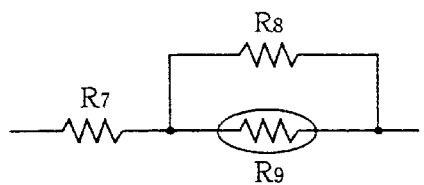
FIG. 2 is view illustrating one example of a basic circuit of a temperature transducer from which a temperature coefficient is capable of being established.
Figure 3A:
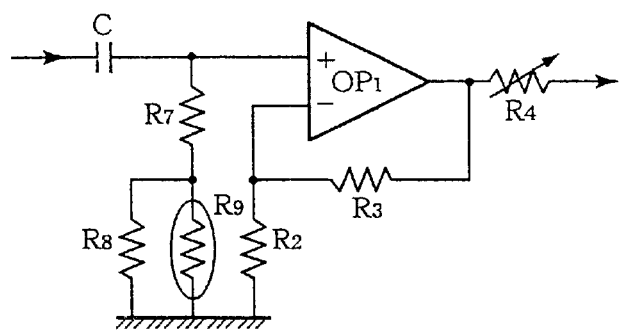
FIGS. 3(A) and 3(B) are circuit views illustrating respective embodiments of variable capacitance circuits to which the temperature coefficients are capable of being established.
Figure 3B:
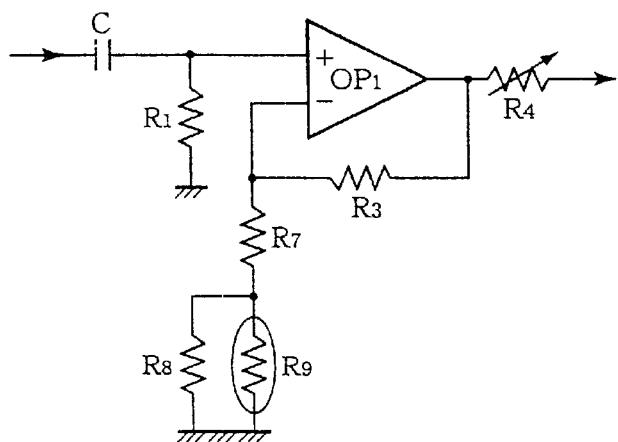

FIG. 2 is one example of a temperature-sensitive circuit for temperature compensation. It is possible to establish the temperature-sensitive circuit in connection with its temperature coefficient into a predetermined one in such manner as to adjust resistance change using temperature of a thermistor $R_9$ for changes in the value of resistors $R_7$ and $R_8$. As illustrated in FIGS. 3(A) and 3(B), this circuit is combined with a part of the amplifier OP1. In the circuit of FIG. 3(A), the circuit of FIG. 2 is employed instead of the resistor $R_1$ of the differentiating circuit of the input of the amplifier OP1. A polarity of the temperature coefficient of the whole circuit can be set to the same direction as the thermistor $R_9$. In a circuit of FIG. 3(B), the circuit of FIG. 2 is employed instead of the resistor $R_2$ of a feedback route of the amplifier OP1. The polarity of the temperature coefficient of the whole circuit can be set to the reverse direction against the thermistor $R_9$.

As described in detail, the circuit of the present invention can also be regarded as the trimmer capacitor, which is capable of being established to provide a necessary temperature coefficient. Accordingly, in particular, the circuit of the present invention is exceedingly useful a fine phase adjustment and so forth necessary for a notch filter and so forth in low frequency band.

What is claimed is:

1. A variable capacitance circuit for fine adjustment of a frequency-amplitude characteristic or a frequency-phase characteristic of a negative feedback operational amplifier circuit comprising:
   a differentiating circuit for generating an output voltage leading an input voltage by a phase angle of 90 degrees;
   an operational amplifier circuit for in phase amplification of said output voltage and providing an amplifier output;
   a variable device for varying said amplified output of said operational amplifier circuit; and
   a temperature transducer circuit provided with said differentiating circuit or with said operational amplifier circuit to establish a predetermined temperature coefficient.

2. The variable capacitance circuit according to claim 1, wherein said operational amplifier circuit includes a current-output type operational amplifier.

3. The variable capacitance circuit according to claim 1, wherein said operational amplifier circuit includes a voltage-output type operational amplifier and wherein said variable device comprises a variable resistor receiving the amplified output of said operational amplifier.

4. The variable capacitance circuit according to claim 1, wherein said temperature transducer circuit comprises a first resistor series connected to the parallel combination of a second resistor and a thermistor, said thermistor providing the predetermined temperature coefficient.

5. The variable capacitance circuit according to claim 1, wherein the predetermined temperature coefficient from said temperature transducer circuit provides temperature compensation for said variable capacitance circuit.

6. The variable capacitance circuit according to claim 1, wherein said differentiating circuit consists of a capacitor and resistor.

7. The variable capacitance circuit according to claim 1, wherein said operational amplifier circuit includes an operational amplifier and a feedback resistor.

8. A variable capacitance circuit for fine adjustment of a frequency-amplitude characteristic or a frequency-phase characteristic of a feedback operational amplifier circuit comprising:
   a capacitor for receiving an input voltage;
   an operational amplifier connected to said capacitor at a positive input thereof, said operational amplifier including a negative input and an output;
   a first resistor electrically connected at one end between said capacitor and said positive input of said operational amplifier and electrically connected at a second opposing end to electrical ground, said first resistor and said capacitor, in combination, comprising a differentiating circuit;
   a second feedback resistor connected between the output and the negative input of said operational amplifier;
   a third resistor having one end electrically connected to the negative input and an opposing end electrically connected to electrical ground;
   a variable resistor series connected at one end to the output of said operational amplifier, the other end of said variable resistor comprising an output of said variable capacitance circuit; and
   a temperature transducer circuit for providing a predetermined temperature coefficient for temperature compensation of said variable capacitance circuit.

9. The variable capacitance circuit according to claim 8, wherein said temperature transducer circuit is series connected at one end to said first resistor and at an opposing end to ground.

10. The variable capacitance circuit according to claim 8, wherein said temperature transducer circuit is series connected at one end to said third resistor and at an opposing end to ground.

11. The variable capacitance circuit according to claim 8, wherein said capacitor comprises a first capacitor and said temperature transducer circuit comprises a fourth resistor and a second capacitor connected in parallel.

12. A variable capacitance circuit for fine adjustment of a frequency-amplitude characteristic or a frequency-phase characteristic of a feedback operational amplifier circuit comprising:
   a capacitor for receiving an input voltage;
   a first operational amplifier connected to said capacitor at a negative input thereof, said operational amplifier including a positive input connected to ground and a first operational amplified output;
   a first feedback resistor electrically connected at one end to the first operational amplifier output and connected at an opposing end to the negative input of said first operational amplifier;
   a second operational amplifier having a negative input, a positive input connected to ground and a second operational amplifier output;
   a second resistor series connected between the output of said first operational amplifier and the negative input of said second operational amplifier;
   a third feedback resistor having one end electrically connected to the second operational amplifier output and an opposing end electrically connected to the negative input of the second operational amplifier; and
   a variable resistor connected at one end to the output of said second operational amplifier, the other end of said variable resistor comprising a variable capacitance circuit output.

\* \* \* \* \*